United States Patent
Mirichigni et al.

(10) Patent No.: US 9,754,648 B2
(45) Date of Patent: Sep. 5, 2017

(54) APPARATUSES AND METHODS FOR MEMORY OPERATIONS HAVING VARIABLE LATENCIES

(71) Applicant: MICRON TECHNOLOGY, INC., Boise, ID (US)

(72) Inventors: Graziano Mirichigni, Vimercate (IT); Corrado Villa, Sovico (IT); Luca Porzio, Volla (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/794,471

(22) Filed: Mar. 11, 2013

(65) Prior Publication Data

US 2014/0122822 A1     May 1, 2014

Related U.S. Application Data

(60) Provisional application No. 61/719,321, filed on Oct. 26, 2012.

(51) Int. Cl.
| | |
|---|---|
| *G11C 7/10* | (2006.01) |
| *G11C 7/22* | (2006.01) |
| *G06F 13/16* | (2006.01) |

(52) U.S. Cl.
CPC .......... *G11C 7/22* (2013.01); *G06F 13/1689* (2013.01); *G11C 7/1063* (2013.01)

(58) Field of Classification Search
CPC ..... G06F 13/1689; G11C 7/22; G11C 7/1063; G11C 8/18; G11C 13/0028
See application file for complete search history.

(56) References Cited

U.S. PATENT DOCUMENTS

| | | | |
|---|---|---|---|
| 4,833,642 A | 5/1989 | Ooi | |
| 5,287,469 A * | 2/1994 | Tsuboi | .......... 711/103 |

(Continued)

FOREIGN PATENT DOCUMENTS

JP     2005108395 A     4/2005

OTHER PUBLICATIONS

"International Search Report & Written Opinion for Appl. No. PCT/US2013/066949 mailed Feb. 14, 2014".

(Continued)

*Primary Examiner* — Nathan Sadler
(74) *Attorney, Agent, or Firm* — Dorsey & Whitney LLP

(57) ABSTRACT

Apparatuses and methods for performing memory operations are described. In an example apparatus, a memory is configured to receive a memory instruction and perform a memory operation responsive to the memory instruction. The memory is further configured to provide an acknowledgement indicative of an end of the variable latency period wherein the acknowledgement includes information related to an acceptance of a memory instruction. Data associated with the memory instruction is exchanged with the memory following the acknowledgement. In an example method a read instruction and an address from which read data is to be read is received. A write operation is suspended responsive to the read instruction and an acknowledgement indicative of an end of the variable latency period is provided. Read data for the read instruction is provided and the write operation is continued to be suspended for a hold-off period following completion of the read operation.

31 Claims, 8 Drawing Sheets

(56) References Cited

U.S. PATENT DOCUMENTS

| | | | |
|---|---|---|---|
| 5,546,344 A | 8/1996 | Fawcett | |
| 5,668,972 A | 9/1997 | Liu et al. | |
| 5,778,432 A | 7/1998 | Rubin et al. | |
| 5,822,244 A * | 10/1998 | Hansen et al. | 365/185.11 |
| 5,892,961 A | 4/1999 | Trimberger | |
| 5,893,149 A | 4/1999 | Hagersten et al. | |
| 5,953,522 A | 9/1999 | Fox et al. | |
| 6,026,034 A * | 2/2000 | Suzuki et al. | 365/190 |
| 6,201,739 B1 * | 3/2001 | Brown et al. | 365/185.29 |
| 6,412,045 B1 | 6/2002 | DeKoning et al. | |
| 6,546,462 B1 | 4/2003 | Palanca et al. | |
| 6,552,956 B2 * | 4/2003 | Shibata | 365/233.1 |
| 6,629,224 B1 * | 9/2003 | Suzuki et al. | 711/167 |
| 6,879,540 B2 * | 4/2005 | Maruyama et al. | 365/189.03 |
| 6,996,016 B2 | 2/2006 | Oh | |
| 7,173,863 B2 | 2/2007 | Conley et al. | |
| 7,363,540 B2 | 4/2008 | Patel et al. | |
| 7,579,683 B1 * | 8/2009 | Falik | G11C 5/02 257/678 |
| 7,590,013 B2 | 9/2009 | Yu et al. | |
| 7,624,209 B1 | 11/2009 | Ansari et al. | |
| 7,643,334 B1 | 1/2010 | Lee et al. | |
| 7,802,039 B2 | 9/2010 | Morita | |
| 7,865,658 B2 * | 1/2011 | Lasser et al. | 711/103 |
| 8,004,884 B2 | 8/2011 | Franceschini et al. | |
| 8,030,981 B2 | 10/2011 | Kim | |
| 8,195,891 B2 | 6/2012 | Trika | |
| 8,539,129 B2 | 9/2013 | Wang | |
| 8,582,356 B2 | 11/2013 | Abdulla | |
| 8,595,441 B1 | 11/2013 | Nakibly et al. | |
| 8,902,684 B2 | 12/2014 | Kwean | |
| 9,042,156 B2 | 5/2015 | Nakura et al. | |
| 9,563,565 B2 | 2/2017 | Bernardi, et al. | |
| 2002/0168816 A1 | 11/2002 | Shibata | |
| 2003/0212865 A1 | 11/2003 | Hicken et al. | |
| 2004/0098549 A1 * | 5/2004 | Dorst | 711/167 |
| 2005/0068812 A1 * | 3/2005 | Oh | 365/193 |
| 2006/0028883 A1 * | 2/2006 | Shimoyama | 365/200 |
| 2006/0069812 A1 | 3/2006 | Osborne | |
| 2006/0268619 A1 * | 11/2006 | Chen | 365/185.22 |
| 2007/0145151 A1 * | 6/2007 | Nakamura | G06F 3/0613 235/492 |
| 2007/0156991 A1 * | 7/2007 | Gould et al. | 711/167 |
| 2007/0217253 A1 * | 9/2007 | Kim et al. | 365/163 |
| 2008/0082707 A1 | 4/2008 | Gupta et al. | |
| 2008/0270811 A1 | 10/2008 | Chow et al. | |
| 2008/0304351 A1 | 12/2008 | Lim et al. | |
| 2008/0307165 A1 | 12/2008 | Kazuhiro | |
| 2008/0320214 A1 | 12/2008 | Ma et al. | |
| 2009/0024778 A1 | 1/2009 | Morita | |
| 2009/0044190 A1 * | 2/2009 | Tringali et al. | 718/102 |
| 2009/0157974 A1 | 6/2009 | Lasser | |
| 2009/0265514 A1 | 10/2009 | Biles et al. | |
| 2010/0013675 A1 | 1/2010 | Bennett | |
| 2010/0023675 A1 | 1/2010 | Chen et al. | |
| 2010/0124090 A1 | 5/2010 | Arai | |
| 2010/0124102 A1 | 5/2010 | Lee et al. | |
| 2010/0161880 A1 | 6/2010 | You | |
| 2010/0172179 A1 | 7/2010 | Gorobets et al. | |
| 2010/0174955 A1 | 7/2010 | Carnevale et al. | |
| 2010/0269118 A1 | 10/2010 | Arimilli et al. | |
| 2010/0293343 A1 | 11/2010 | Perego | |
| 2011/0047319 A1 | 2/2011 | Jeon et al. | |
| 2011/0055453 A1 * | 3/2011 | Bennett | 711/103 |
| 2011/0072190 A1 * | 3/2011 | Borracini et al. | 711/103 |
| 2011/0153900 A1 * | 6/2011 | Zitlaw | 710/313 |
| 2011/0170354 A1 | 7/2011 | DeCaro et al. | |
| 2011/0197014 A1 | 8/2011 | Yeh | |
| 2011/0238866 A1 | 9/2011 | Zitlaw | |
| 2011/0289255 A1 | 11/2011 | Wang et al. | |
| 2011/0314324 A1 | 12/2011 | Ozdemir | |
| 2012/0017053 A1 | 1/2012 | Yang et al. | |
| 2012/0054419 A1 | 3/2012 | Chen et al. | |
| 2012/0117303 A1 | 5/2012 | Carannante et al. | |
| 2012/0124317 A1 | 5/2012 | Mirichigni et al. | |
| 2012/0131263 A1 | 5/2012 | Yeh | |
| 2012/0131304 A1 | 5/2012 | Franceschini et al. | |
| 2012/0173809 A1 | 7/2012 | Ko et al. | |
| 2012/0179860 A1 | 7/2012 | Falanga et al. | |
| 2012/0265922 A1 | 10/2012 | Post et al. | |
| 2012/0324141 A1 | 12/2012 | Seong et al. | |
| 2013/0036253 A1 | 2/2013 | Baltar | |
| 2013/0058175 A1 * | 3/2013 | Lin et al. | 365/193 |
| 2013/0159766 A1 | 6/2013 | D'Abreu et al. | |
| 2013/0191601 A1 | 7/2013 | Peterson et al. | |
| 2013/0262746 A1 | 10/2013 | Srinivasan | |
| 2014/0013028 A1 | 1/2014 | Rametta | |
| 2014/0082259 A1 | 3/2014 | Yeh | |
| 2014/0122814 A1 | 5/2014 | Mirichigni et al. | |
| 2014/0281182 A1 | 9/2014 | Mirichigni et al. | |
| 2015/0052288 A1 | 2/2015 | Mirichigni et al. | |
| 2015/0052299 A1 | 2/2015 | Mirichigni et al. | |
| 2015/0095551 A1 | 4/2015 | Minopoli et al. | |
| 2015/0347038 A1 | 12/2015 | Monteleone et al. | |
| 2017/0083263 A1 | 3/2017 | Mirichigni et al. | |

OTHER PUBLICATIONS

"International Search Report & Written Opinion for Appl. No. PCT/US2013/066947 mailed Feb. 10, 2014".

Extended European Search Report for EP Application No. 13849956.1 dated Sep. 2, 2016.

Notice of Rejection dated May 10, 2016 for JP Application No. 2015-539871.

First Rejection Action for Korean Patent Application No. 10-2015-7012530 dated Nov. 20, 2016.

"available" - Definition from Wiktionary, the free dictionary— Archived revision by Tuvalkin (talk | contribs) as of 21:49, Jan. 5, 2012. https://en.wiktionary.org/w/index.php?title=available &oldid=15765189 Downloaded Jan. 13, 2016.

"JEDEC—Low Power Double Data Rate 2 (LPDDR2)", Feb. 2010. Handy, J., "The Cache Memory Book Second Edition", Academic Press Prof., Inc., San Diego, CA, Jan. 1993, p. 67.

Qureshi, et al., "Enhancing Lifetime and Security of PCM-Based Main Memory with Start-Gap Wearing Leveling", Microarchitecture, 2009 42nd Annual IEEE/ACM International Symposium, Dec. 12-16, 2009, 14-23.

\* cited by examiner

| DQ3 | DQ2 | Wait State |
|---|---|---|
| 0 | 0 | Asserted – "SHORT" |
| 0 | 1 | Asserted – "NORMAL" |
| 1 | 0 | Asserted – "LONG" |

Figure 4A

| DQ3 | DQ2 | DQ1 | Current Read Instruction | Current Write Instruction |
|---|---|---|---|---|
| 0 | 0 | 1 | Accepted | |
| 0 | 1 | 1 | | Accepted but house keeping operation suggested Action: Issue house keeping instruction |
| 1 | 0 | 1 | | Accepted but there has been an error during a previous operation (e.g. lock error) Action: Check FSR |
| 1 | 1 | 1 | NA | Rejected due to an error (e.g. lock error) Action: Check FSR |

Figure 5

APPARATUSES AND METHODS FOR MEMORY OPERATIONS HAVING VARIABLE LATENCIES

CROSS-REFERENCE TO RELATED APPLICATION

This application claims priority to U.S. Provisional Patent Application No. 61/719,321, filed Oct. 26, 2012. This application is incorporated by reference herein in its entirety and for all purposes.

TECHNICAL FIELD

Embodiments of the invention relate generally to memories, and include examples of write and read operations having variable latencies which may be used with memories having phase change memory.

BACKGROUND OF THE INVENTION

Memory devices may be provided in apparatuses such as computers or other electronic devices, including but not limited to portable memory devices, solid state drives, personal digital assistants, music players, cameras, phones, wireless devices, displays, chip sets, set top boxes, gaming systems, vehicles, and appliances. There are many different types of memory including random-access memory (RAM), read only memory (ROM), dynamic random access memory (DRAM), synchronous dynamic random access memory (SDRAM), flash memory, and resistance variable memory, among others.

Apparatuses, such as resistance variable memory devices, may be used as non-volatile memory for a wide range of electronic devices. Resistance variable memory devices may include, for example, phase change memory (PCM) or resistive memory (RR), among others. A physical layout of a PCM device may resemble that of a DRAM device where the capacitor of the DRAM cell is replaced by a phase change material, e.g., Germanium-Antimony-Telluride (GST) or other chalcogenide materials. That is, an access device such as a diode or metal oxide semiconductor field effect transistor (MOSFET) can be connected in series with the phase change material. Chalcogenide materials can include compounds of sulfides, selenides, or tellurides, among others. GST has been used in rewriteable optical discs, e.g., rewritable compact discs (CD-RW) and rewritable digital versatile discs (DVD-RW).

PCM may be written to change from a first state (e.g., logic "0") to a second state (e.g., logic "1") as with non-volatile memories. PCM may also be written to change from the second state to the first state. A conventional read operation to PCM is also similar to RAM. As such, PCM may be used in random-access memory. Write operations with PCM, however, are relatively slower than for conventional RAM. That is, time may be needed to manage and complete write operations, such as preparing data to be written to memory, suspending a write operation in case of a read access request, as well as to monitor the progress of a write operation. Read operations may be slower than for conventional RAM and read operations cannot be performed on a memory location that is involved in a concurrent write operation.

As a result of the limitations of using PCM as RAM replacement, operation of PCMs in memory systems is restricted in several ways. For example, write and read operations may not be performed at any time on any memory location. Status registers used for monitoring the progress of write operations may be regularly polled to determine completion of a write operation before starting a new write operation. Additionally, in some applications write operations are necessarily suspended for read operations and resumed upon completion of the read operation.

BRIEF DESCRIPTION OF THE DRAWINGS

FIG. 4A is a table of wait states according to an embodiment of the invention.

FIG. 5 is a table of information provided by an acknowledgement according to an embodiment of the invention.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
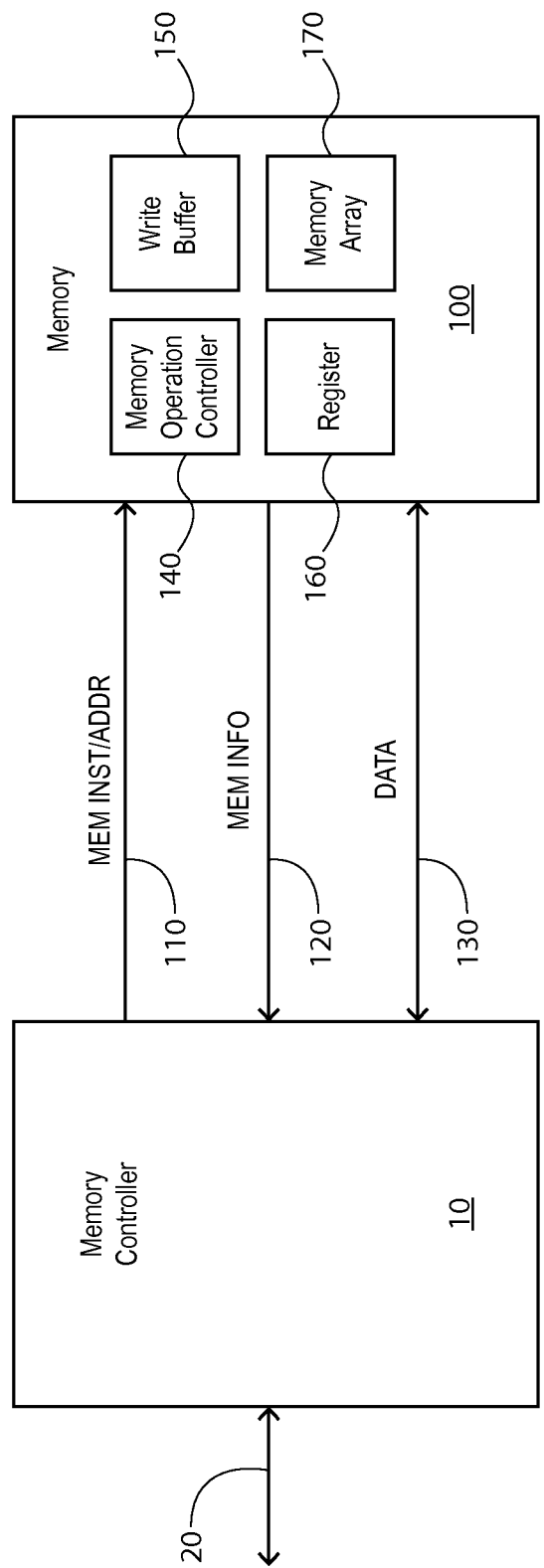
FIG. 1 is a block diagram of an apparatus according to an embodiment of the invention.

FIG. 1 illustrates an apparatus according to an embodiment of the invention. The apparatus may comprise circuitry, one or more semiconductor dice, a packaged semiconductor, a device including such circuitry, die, or package, and/or a system including such a device, and may include a memory controller 10 that is coupled to a memory 100. The memory controller 10 is also coupled to a system bus 20. The memory controller 10 provides the memory 100 memory instructions and memory addresses on a bus 110. The memory 100 includes a memory array 170 having memory cells for storing data, and further includes a memory operation controller 140 configured to receive the memory instructions and control memory operations of the memory 100. A write buffer 150 included in the memory 100 may be used to store write instructions and data and a register 160 may be used to store values related to the configuration and operation of the memory 100, as will be described in more detail below. Although shown as separate elements in FIG. 1, the memory operation controller 140, write buffer 150, and register 160 may be combined in various different arrangements that include one or more of the memory operation controller 140, write buffer 150, and register 160. For example, the memory operation controller 140 may include the register 160 in some embodiments.

The memory 100 performs memory operations in response to the memory instructions and addresses. The memory 100 provides various information to the memory controller 10 on a bus 120. As will be described in more detail below, the information provided by the memory 100 may include information related to a memory operation performed for a memory instruction, remaining time of a variable latency period, an acknowledgement indicating an end of the variable latency period, as well as other information that may be related to the memory 100. Data may be exchanged with the memory 100 over bus 130, for example, read data is provided by the memory 100 to the memory controller 10 for a read instruction, and in another example, write data is provided by the memory controller 10 to the memory 100 for a write instruction.

The information provided by the memory 100 may be used in managing operations between the memory controller 10 and the memory 100. For example, the acknowledgement may be used as a wait signal for the system bus 20, which remains busy until a memory operation ends. Another example is using the acknowledgement to determine whether to keep the system bus 20 busy until a memory operation is completed, or abort an operation (for example, deselecting the memory 100) in order to free the system bus 20 (for the same master for other operations or for other masters/peripherals such as frame buffers, etc.) and retry at a later time. Information related to the remaining time of a variable latency period may also be provided to assist in determining whether to keep the system bus 20 busy, or abort an operation and retry at a later time.

In operation, memory instructions and memory addresses are received by the memory 100, for example, from the memory controller 10 and a memory operation is performed. A variable latency period tLAT follows receipt of the memory instruction and memory address. An end of the latency period is indicated by an acknowledgement ACKNOWLEDGE provided by the memory 100, after which data may be exchanged with the memory (e.g., providing data to the memory controller 10 following the ACKNOWLEDGE, receiving data from the memory controller 10 following the ACKNOWLEDGE, or both providing/receiving data following the ACKNOWLEDGE). During the tLAT period, the memory 100 may manage memory operations. For example, during the tLAT period the memory may prepare itself for the memory operation (e.g., such as preparing memory circuits for performing the memory operation), complete a memory operation in progress, suspending an operation in progress to begin performing the memory operation, or manage other memory operations. The memory 100 may also complete an operation in progress during the tLAT period, for example, before performing the memory operation for the memory instruction received. As such, the tLAT period may vary over a range of time, from relatively short to relatively long, with the ACKNOWLEDGE indicating the end of the tLAT period. The ACKNOWLEDGE may also be used to inform a host if the tLAT period is ongoing or has ended. In some embodiments, the memory 100 may provide information related to the time for the tLAT period during the tLAT period. In an example, the memory 100 provides information related to the time for the tLAT period, and may further provide updated information related to the time for the tLAT period. The updated information may reflect how much longer the tLAT period may be.

In some embodiments, a memory operation controller in a memory (e.g., memory operation controller 140 of memory 100) may decode memory instructions and provide internal signals to manage resulting memory operations to allow data to be written to and allow data to be read from a memory array of the memory (e.g., memory array 170 of memory 100) without the same timing limitations of conventional phase change memory (PCM). For example, in some embodiments, data may be read from a location in the memory array even if the location is currently involved with a write operation. In some embodiments, suspension and resumption of internal memory operations (e.g., write and read operations) may be less constrained in comparison to convention PCMs, and thus provide greater operational flexibility of the memory. For example, a write operation may not necessarily be suspended in favor of a read operation, and suspended write operations may be resumed according to more flexible timing conditions.

In summary, during the tLAT period the memory is being prepared for the operation or to complete an operation. For example, during this time, the memory determines whether a previous operation is in progress; if not then a current operation may be performed immediately after a relatively short tLAT period. If a previous operation is already in progress, the memory will decide how to manage the current and previous operations. It may be that the previous operation is suspended to allow the current operation to be performed. In this case, the tLAT period may be relatively short. If, however, the memory decides to complete the previous operation before performing the current operation the LAT period may be relatively long.

Embodiments of the invention may be utilized with various memory interfaces. For example, some embodiments may be utilized with serial memory interfaces. Some embodiments of the invention may be utilized with memory mapped interfaces, including LPDDR2-N, NOR, as well as other memory interfaces as well.

Examples of memory instructions are a write instruction and a read instruction. A write instruction causes a write operation to be performed by the memory 100, with write data received by the memory being written to memory locations corresponding to a memory address. A read instruction causes a read operation to be performed by the memory 100, with read data provided by the memory from memory locations corresponding to a memory address.

Figure 2A:
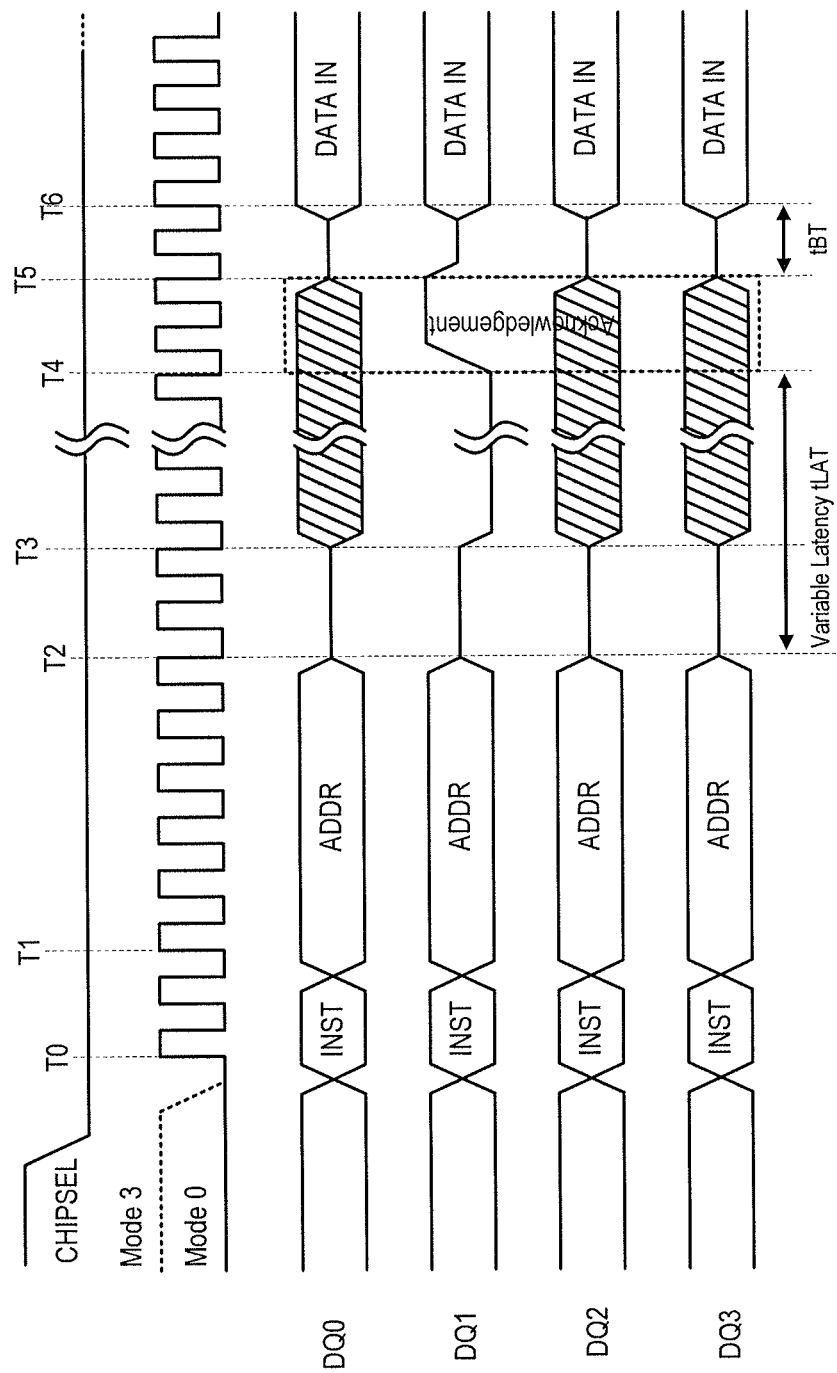
FIG. 2A is a timing diagram of various signals for a write operation according to an embodiment of the invention.

Write instructions according to an embodiment of the invention are received by the a memory to perform a write operation. Generally, in such embodiments, the write instruction and memory address are received by the memory, and a variable latency period follows the receipt of the instruction and the address. An end of the latency period is indicated by an acknowledgement ACKNOWLEDGE provided by the memory, after which write data for the write instruction may be received by the memory. As will be described in more detail below, in some embodiments a maximum time for the tLAT period may be defined, for example, by programming a register that includes a value for a maximum tLAT. FIG. 2A illustrates the timing of a write operation according to an embodiment of the invention.

Prior to time T0 a memory select signal S/(active low) and mode signals MODE become active, causing the memory to become active. Between times T0 and T1 a write instruction is received by the memory on input/outputs DQ0-DQ3 of the memory. Between times T1 and T2 an address corresponding to the location for the write instruction is received. Following time T2 is a latency period tLAT. The tLAT period may be variable, with an end of the tLAT period indicated by an acknowledgement ACKNOWLEDGE provided by the memory. Between times T2 and T3 is a bus turnaround period to allow DQ0-DQ3 to change direction of the exchange of information, if desired. During the bus turnaround time DQ0-DQ3 may be in a high-impedance "Hi-Z" state, as shown in FIG. 2A. As previously discussed, the memory provides an ACKNOWLEDGE to indicate an end of the tLAT period. The memory may use one or more of DQ0-DQ3 to provide the ACKNOWLEDGE. In the embodiment of FIG. 2A, the memory uses DQ1 for the ACKNOWLEDGE. Following time T3 the memory provides a logic "0" on DQ1, and DQ0, DQ2, and DQ3 may be any logic state (i.e., "don't care").

At time T4 the memory provides an ACKNOWLEDGE. The ACKNOWLEDGE is represented in FIG. 2A as the memory changing the logic state of DQ1 from logic "0" to logic "1." The ACKNOWLEDGE may be provided by the memory for a period of time (e.g., a number of clock cycles), after which write data may be received by the memory. In FIG. 2A, for example, the ACKNOWLEDGE is provided by the memory on DQ1 over two clock cycles from time T4 to time T5. Although illustrated in FIG. 2A as a change in logic state from "0" to "1" on DQ1, the ACKNOWLEDGE may be provided on another DQ, or more than one DQ. The ACKNOWLEDGE may be represented by other than changing from "0" to "1," for example, "1" to "0," Hi-Z to a logic state, or other representations. Additionally, the ACKNOWLEDGE may be provided by the memory for shorter or longer than that specifically illustrated in FIG. 2A. Following the ACKNOWLEDGE between times T4 and T5 may be a bus turnaround time tBT. The tBT may be provided in order to avoid bus contention between the memory providing the ACKNOWLEDGE and receiving the write data. Write data is received by the memory at time T6 following the tBT.

The tBT may be a specific number of clock cycles tCK measured relative to the ACKNOWLEDGE. In the example of FIG. 2A, the tBT is shown as 1 tCK, measured from a first rising edge after the ACKNOWLEDGE. In some embodiments, the tBT may be programmable, for example, by programming a register that includes a tBT setting. The tBT may be programmable as various configurable times or a variable time. When the tBT is programmed as a configurable time, one of several choices of clock cycles may be selected, such as a tBT of 1 tCK, 2 tCK, or 3 tCK as measured relative to the ACKNOWLEDGE. In an example where the tBT is programmed as a configurable time of 1 tCK, FIG. 2A also illustrates the resulting tBT. For a configurable tBT of 2 tCK the time between T5 and T6 would be one clock cycle longer and for a configurable tBT of 3 tCK the time between T5 and T6 would be two clock cycles longer.

Figure 2B:
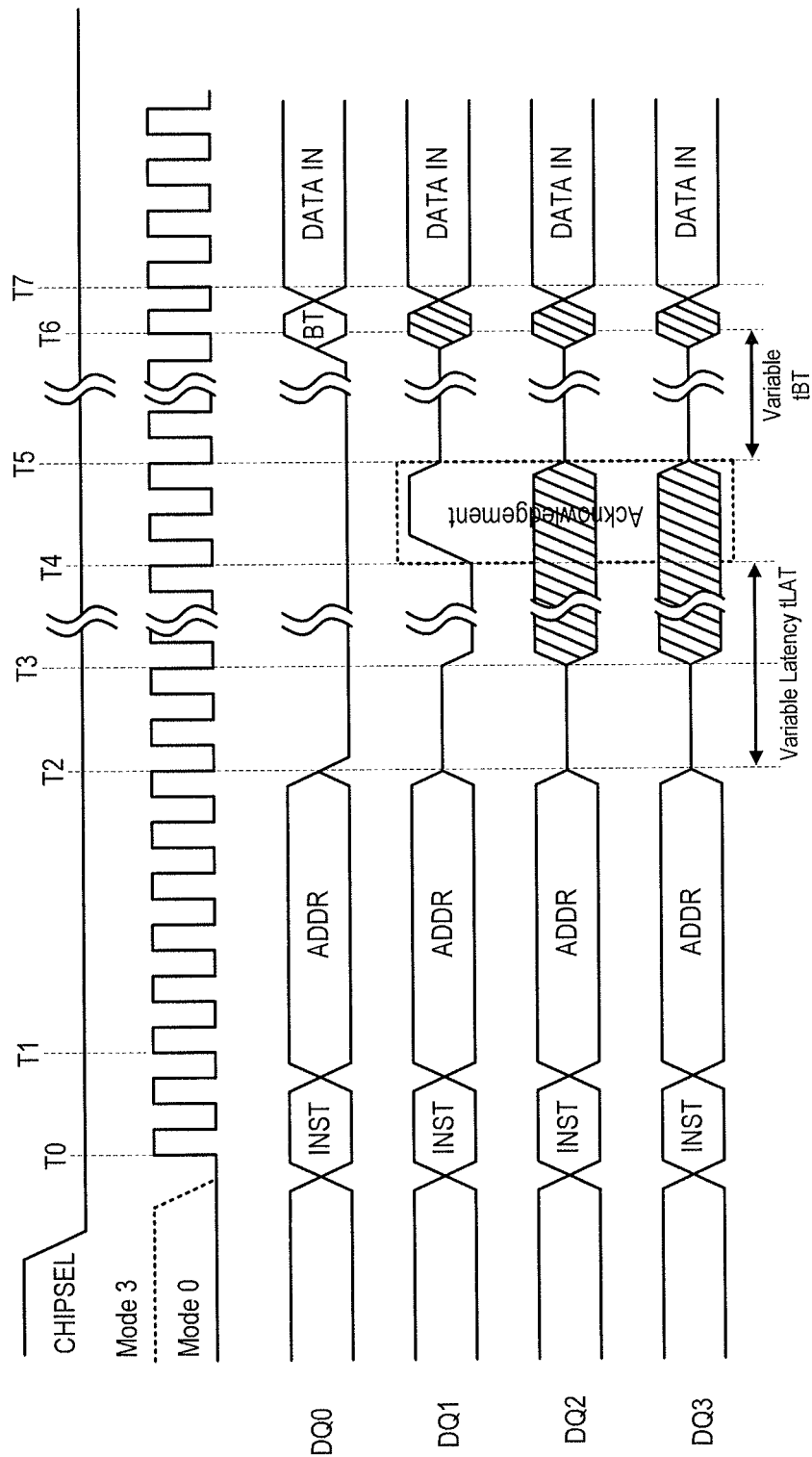
FIG. 2B is a timing diagram of various signals for a write operation according to another embodiment of the invention.

A variable tBT provides for the write data to be received by the memory at a variable time relative to the ACKNOWLEDGE. FIG. 2B illustrates a timing for a write operation having a variable tBT according to an embodiment of the invention. As with FIG. 2A, a memory select signal S/and mode signals MODE are active prior to time T0. At time T0 the write instruction is received by the memory and the address is received at time T1. Following T2 is the tLAT period, which as previously discussed, may be variable and have an end indicated by the ACKNOWLEDGE. A bus turnaround period is shown between times T2 and T3 for DQ1-DQ3 as a Hi-Z state. The memory receives a logic "0" on DQ0. DQ0 is used to indicate an end of a variable tBT, as will be described in more detail below. At time T3 the memory provides a logic "0" on DQ1, which is used to provide the ACKNOWLEDGE indicating an end of the tLAT period, and DQ2 and DQ3 are don't care. The ACKNOWLEDGE is provided by the memory between times T4 and T5 on DQ1, as represented by changing the logic state from "0" to "1." A variable tBT follows the ACKNOWLEDGE.

In FIG. 2B, the input/output DQ0 may be used by the memory to receive a tBT end indicator (BT) which indicates the end of the variable tBT. In the embodiment of FIG. 2B, the tBT end indicator is received by the memory on DQ0 at time T6, and precedes the write data received by the memory at T7. DQ1-DQ3 are don't care. The tBT end indicator notifies the memory of the end of the variable tBT and that write data will follow. In this manner, the length of tBT can be determined by the host (with an end indicated by BT), rather than having a configurable tBT (e.g., 1 tCK, 2 tCK, 3 tCK, etc.) and without using a separate dedicated signal line for the tBT end indicator. In other embodiments the tBT end indicator may be provided on a different DQ or on more than one DQ. Additionally, the tBT end indicator may be longer or shorter than that shown in FIG. 2B.

As previously described, during the tLAT period the memory may manage memory operations. For example, during the tLAT period the memory may prepare itself for the write operation, such as preparing memory circuits for performing the write operation, suspending an operation in progress to begin performing the write operation, or manage other memory operations. The memory may also complete an operation in progress during the tLAT period, for example, before performing the write operation for the write instruction. The tLAT period may vary over a range of time. In some embodiments, the time for a tLAT period may be characterized over a range from relatively short to relatively long, with the ACKNOWLEDGE indicating the end of the tLAT period.

It will be appreciated that the invention is not limited to the particular embodiments described with reference to FIGS. 2A and 2B. For example, in an embodiment of the invention the write instruction is 8-bits (1 byte) and the address is 24-bits (3 bytes) received over a plurality of clock cycles. However, instructions and addresses of different lengths may be used as well, and received over a number of clock cycles different than that illustrated in FIGS. 2A and 2B. Additionally, the order in which an instruction and address are received by the memory may be different without departing from the scope of the invention. FIGS. 2A and 2B illustrate an embodiments where input/output DQ0-DQ3 are shared for instructions, addresses, and data. In some embodiments, however, memory instructions may be received on a dedicated input, and addresses and data share another input/output. In some embodiments, memory instructions and addresses may be received on a shared input; and data received/provided on dedicated input/outputs. The ACKNOWLEDGE is shown in FIGS. 2A and 2B as being provided over two clock cycles, but in other embodiments the ACKNOWLEDGE may be provided over a different number of clock cycles. The time at which the write data may be received may follow a specific number of clock cycles after the ACKNOWLEDGE, or in some embodiments, the write data may be received at a time subsequent to the ACKNOWLEDGE, for example, as previously discussed, after a configurable or variable bus turnaround time.

A buffer may be included in a memory (e.g., memory 100 of FIG. 1) in some embodiments and used to store write data and corresponding write instructions until a sufficient number of write instructions/data are accumulated, at which time write operations for the buffered write instructions are performed. As a result, several write instructions may have relatively short tLAT periods (those buffered) followed by a write instruction having a tLAT period that is longer than the relatively short tLAT period. Write operations for the buffered write instructions are performed during the longer tLAT period. The buffer may be accessible so that buffered write data is accessible for a read operation if the buffered write data is to be read, such as to keep cached data coherency.

Figure 3:
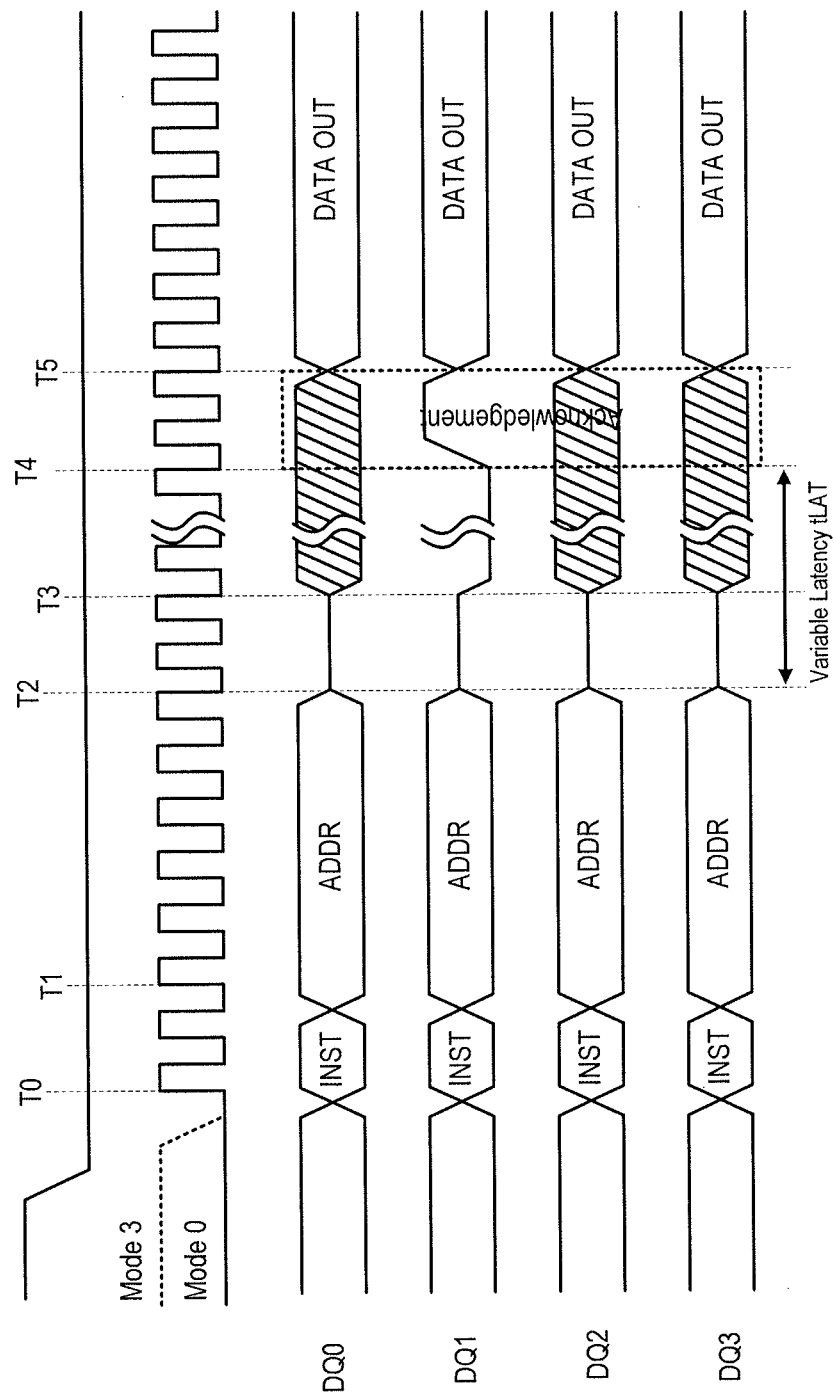
FIG. 3 is a timing diagram of various signals for a read operation according to an embodiment of the invention.

Read instructions according to an embodiment of the invention are received by a memory to perform a read operation. Generally, in such embodiments, the read instruction and memory address are received by the memory, and a variable latency period follows the receipt of the instruction and the address. An end of the latency period is indicated by an acknowledgement ACKNOWLEDGE provided by the memory, after which read data for the read instruction is provided by the memory. As will be described in more detail below, in some embodiments a maximum time for the tLAT period may be defined, for example, by programming a register that includes a value for a maximum tLAT. FIG. 3 illustrates the timing of a read operation according to an embodiment of the invention.

Prior to time T0 a memory select signal S/(active low) and mode signals MODE are active, causing the memory to become active. Between times T0 and T1 a read instruction is received by the memory. Between times T1 and T2 an address corresponding to the location for the read instruction is received. Following time T2 is a latency period tLAT. The tLAT period may be variable, with an end of the tLAT period indicated by an acknowledgement ACKNOWLEDGE provided by the memory, after which read data may be provided by the memory. A bus turnaround period is shown between times T2 and T3 for DQ0-DQ3 as a Hi-Z state. At time T3 the memory provides a logic "0" on DQ1, which is used to provide the ACKNOWLEDGE indicating an end of the tLAT period, and DQ0, DQ2, and DQ3 are don't care. The ACKNOWLEDGE is provided by the memory between times T4 and T5 on DQ1, as represented by changing the logic state from "0" to "1." Read data is provided by the memory at time T5.

As previously described, during the tLAT period the memory may manage memory operations. For example, during the tLAT period the memory may prepare itself for the read operation, such as preparing memory circuits for performing the read operation, suspending an operation in progress to begin performing the read operation, or manage other memory operations. The memory may also complete an operation in progress during the tLAT period, for example, before performing the read operation for the read instruction. The tLAT period may vary over a range of time, with the ACKNOWLEDGE indicating the end of the tLAT period.

It will be appreciated that the invention is not limited to the particular embodiment described with reference to FIG. 3. For example, in an embodiment of the invention the read instruction is 8-bits (1 byte) and the address is 24-bits (3 bytes) received over a plurality of clock cycles. However, instructions and addresses of different lengths may be used as well, and received over a number of clock cycles different than that illustrated in FIG. 3. Additionally, the order in which an instruction and address are received by the memory may be different without departing from the scope of the invention. FIG. 3 illustrates an embodiments where input/outputs DQ0-DQ3 are shared for instructions, addresses, and data. In some embodiments, however, memory instructions may be received on a dedicated input, and addresses and data share another input/output. In some embodiments, memory instructions and addresses may be received on a shared input, and data received/provided on dedicated input/outputs. The ACKNOWLEDGE is shown in FIG. 3 as being provided over two clock cycles, but in other embodiments the ACKNOWLEDGE may be provided over a different number of clock cycles.

As previously described, during a tLAT period a memory may manage memory operations. The time for the tLAT period may be affected by the manner in which the memory manages memory operations. As previously described, the ACKNOWLEDGE is provided by the memory to indicate an end of the tLAT period after which data is to be exchanged (e.g., write data provided to the memory for a write operation and read data provided by the memory for a read operation). In the embodiments illustrated with reference to FIGS. 2A, 2B, and 3, the end of the tLAT period coincides with the beginning of the ACKNOWLEDGE. In other embodiments, the end of a tLAT period may include the ACKNOWLEDGE and end coincident with ACKNOWLEDGE or extend several clock cycles after the ACKNOWLEDGE, but end before data is exchanged with the memory.

In some embodiments, the ACKNOWLEDGE may be used to inform a host that the tLAT period is ongoing or has ended. For example, as previously described the memory may provide a signal on a DQ having a logic state that indicates whether the tLAT period is ongoing or ended, transitioning from one logic state to another at the time the tLAT period ends (e.g., as part of the ACKNOWLEDGE indicating an end of the tLAT period). While the tLAT period is ongoing, signals on other DQs may be don't care, and/or at least one DQ is used to receive a signal from a host.

In some embodiments, information may be provided by the memory during the tLAT period, for example, related to the operation for a memory instruction. As previously discussed, the memory may provide information related to the time for the tLAT period, and may further provide updated information during the tLAT period related to the remaining time of the tLAT period. Example information that may be provided includes a wait state which is related to how much longer tLAT may be. The information may be represented by one or more signals, with the combination of the logic states of the signals indicating the information conveyed during tLAT. For example, a first signal (e.g., a first DQ signal) may have a logic state that indicates whether the tLAT period is ongoing or has ended, transitioning from one logic state to the other at the time the tLAT period ends (e.g., as part of ACKNOWLEDGE indicating an end of the tLAT period). While the tLAT period is ongoing, a second and third signal (e.g., second and third DQ signals) may have a combination of logic states that indicates a wait state.

FIG. 4A illustrates a table of wait states provided by the memory on the input/outputs DQ2 and DQ3. Each of the wait states is indicated by a respective logic combination provided on DQ2-DQ3. For example, a "normal" wait state is indicated by a "10" combination provided on DQ2-DQ3, and "short" and "long" wait states are indicated by providing "00" and "01" combinations on DQ2-DQ3, respectively. In some embodiments, as previously discussed, the memory may use DQ1 to provide an ACKNOWLEDGE indicate whether the tLAT period is ongoing (e.g., DQ1="0") or ending (e.g., DQ1="1"). The logic "0" may be provided by the memory on DQ1 during the tLAT period, with the memory providing a logic "1" on DQ1 to indicate an end of the tLAT period. The change of logic states on DQ1 may be included as part of the ACKNOWLEDGE indicating an end of the tLAT period.

The wait states of short, normal, and long are relative, and in some embodiments may be based on a measure of time. For example, an increment of time may be used as a measure for normal and long wait states. An example increment of time may be 20 us. That is, when a remaining time for the tLAT period is greater than the time increment (e.g., greater than 20 us) a "01" combination is provided by the memory on DQ2 and DQ3 to indicate that the wait state is long. When the remaining time for the tLAT period is less than the time increment (e.g., less than 20 us) a "10" combination is provided by the memory on DQ2 and DQ3 to indicate that the wait state is normal. The memory may provide a "00" combination on DQ2 and DQ3 indicating a short wait state when the remaining time for the tLAT period is less than another time increment shorter than the time increment used as a measure for the normal and long wait states. For example, a short wait state may be provided when the remaining time for the tLAT period is less than 1 us. Time increments other than those previously described may be used without departing from the scope of the invention. Moreover, additional or alternative wait states or other information may be conveyed during a tLAT period as well as using other combinations of logic states to indicate the wait states or other information.

Figure 4B:
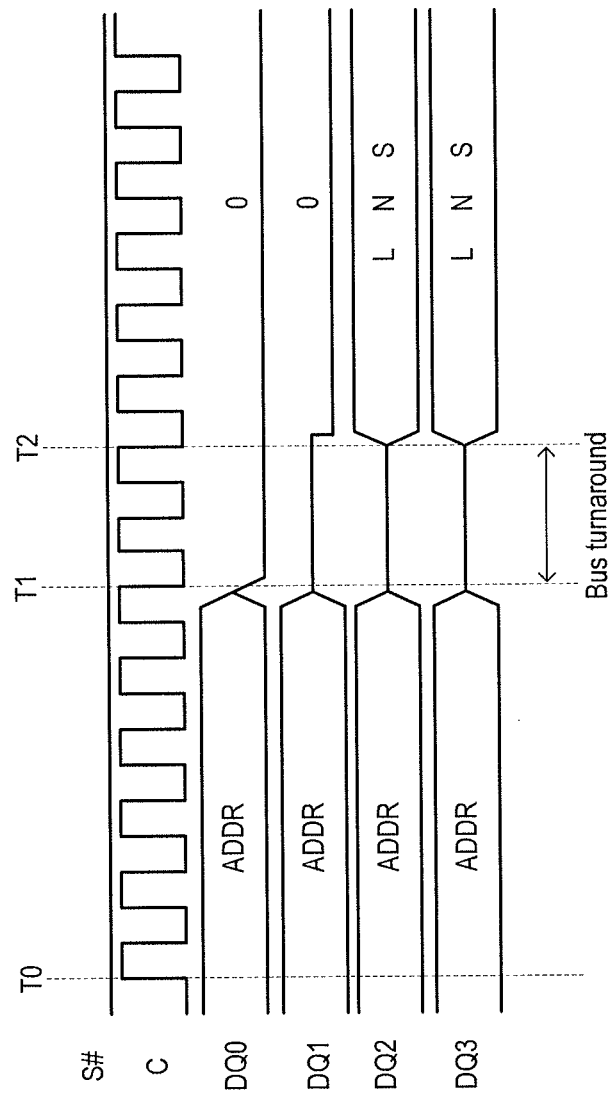
FIG. 4B is a timing diagram of various signals for a memory operation according to an embodiment of the invention.

FIG. 4B illustrates the timing for a portion of a memory operation with the memory providing information related to the remaining time of the tLAT period according to an embodiment of the invention. By time T0, the memory has received a memory instruction (not shown in FIG. 4B) for a memory operation and the address associated with the memory instruction is received between times T0 and T1. Between times T1 and T2 is a bus turnaround time to avoid bus contention between the memory receiving the address and providing information related to the remaining time of the tLAT period. The bus turnaround time following the address is shown in FIG. 4B as two tCKs long, however, the bus turnaround time may be other times as well, whether configurable or variable in length. In the embodiment of FIG. 4B, information related to the remaining time of the tLAT period is provided by the memory using DQ2 and DQ3. The combination of logic states provided by the memory on DQ2 and DQ3 indicates whether, for example, the remaining time for the tLAT period is "long," "normal," or "short." The information provided by the memory may update over the tLAT period, with the logic states of DQ2 and DQ3 updated by the memory accordingly.

The logic states of DQ0 and DQ1 may be used during the tLAT period for other than providing information related to the remaining time for the tLAT period. DQ0 and DQ1 are shown in FIG. 4B as being driven to "0" logic states. However, DQ0 and DQ1 may be other logic states without departing from the scope of the invention. As previously discussed, DQ0 may be used by the memory during the tLAT period to receive a tBT end indicator BT (for variable tBT) and DQ1 may be used by the memory to provide an ACKNOWLEDGE by changing the logic state from logic "0" to logic "1" (not shown). In other embodiments, the memory does not provide any information on either or both DQ0 and DQ1, and/or provides logic states other than those specifically illustrated in FIG. 4B.

As previously discussed, the ACKNOWLEDGE indicates an end of a tLAT period, and in some embodiments of the invention may also include information. For example, the ACKNOWLEDGE may also include information related to whether the memory instruction is accepted or rejected. If accepted, a memory operation for the accepted memory instruction will be performed. Information related to acceptance of a memory instruction may include further qualification, such as the instruction has been accepted but there is an error during an operation of a previous instruction, or the operation has been accepted but there is a warning due to the need of a house keeping operation (e.g., wear leveling, refresh, etc.). In contrast, if rejected, a memory operation for the rejected memory instruction will not be performed. A memory instruction may be rejected, for example, due to an error condition in the memory, or for other reasons that prevent the memory from performing the memory operation.

The ACKNOWLEDGE may be represented by one or more signals, with the combination of logic states of the signals indicative of the information conveyed by the ACKNOWLEDGE. For example, a first signal (e.g., a first data signal) may change logic states to represent an end of the tLAT period, and the combination of logic states of a second and third signal (e.g., second and third data signals) at the time the first signal has changed logic states may indicate additional information, such as acceptance or rejection of the memory instruction.

FIG. 5 illustrates a table of information provided by an ACKNOWLEDGE according to an embodiment of the invention. DQ1, DQ2, and DQ3 are used in the embodiment, and the combination of logic states provided by the memory on DQ1-DQ3 indicate the ACKNOWLEDGE information As shown, the ACKNOWLEDGE may indicate the end of the tLAT period, and may further include information related to whether the instruction was accepted, accepted with qualification, or rejected due to an error.

Additional or alternative information may be included in the ACKNOWLEDGE as well as using other combinations of logic states to indicate the information without departing from the scope of the invention.

The time for the variable latency period may be based on various factors. For example, the time for the variable latency period may be based at least in part on a current memory operation. The time for the variable latency period may be further based at least in part on the memory instruction received. Where the memory is idle when a memory instruction is received, for example, the memory may begin performing the memory operation as soon as possible, resulting in a tLAT period that is relatively short. For example, receipt of a read instruction or a write instruction when the memory is idle results in the memory preparing to perform the memory operation and beginning the operation in a relatively short time, thus the tLAT period may be relatively short and the read data may be provided by the memory or the write data provided to the memory relatively soon after the read or write instruction, respectively, is received.

In contrast, if a memory operation is in progress at the time when a memory instruction is received, the memory may complete the operation in progress before beginning performance of the memory operation for the received memory instruction. As a result, the tLAT period may be longer than a relatively short tLAT period, and may be a relatively long tLAT period due to the time needed to complete the operation in progress. For example, a write operation may be in progress when a read instruction is received by the memory. The memory may complete the write operation before beginning the operation for the read instruction, thus, the tLAT period for the read instruction may be longer than a relatively short tLAT period. Where more than one write instruction is being performed (e.g., performing buffered write instructions) the tLAT period for the read instruction may be relatively long.

In some embodiments, the memory may suspend an operation in progress to begin performing the operation for a received memory instruction. The memory operation for the received memory instruction may be completed without having to wait for the operation that is suspended to be completed. As a result, the tLAT period for the received memory instruction is shorter than a relatively long tLAT period, and may be a relatively short tLAT period. When the operation for the received instruction is completed, the memory may resume performing the suspended operation. For example, an operation for a write instruction may be in progress when a read instruction is received by the memory. The memory may suspend the operation for the write instruction and begin performing the operation for the received read instruction. By not waiting for the operation for the write instruction to complete before beginning operation for the read instruction, the tLAT for the read instruction will be a relatively long tLAT period.

The memory may continue suspending the operation that was in progress if additional memory instructions are received during performance of the received memory instruction, or in some embodiments, if additional memory instructions are received within a hold-off period tHOLDOFF. In some embodiments the tHOLDOFF period is measured from completion of the additional memory instruction. In some embodiments, the tHOLDOFF period is measured from, for example, receipt of the additional memory instructions, or a different event related to the additional memory instruction. Receipt of a memory instruction within the tHOLDOFF period restarts the tHOLDOFF period at the completion of the memory operation so that other memory instructions received in the new tHOLDOFF period will continue to cause suspension of the suspended operation. The tHOLDOFF period allows for additional memory instructions received within the tHOLDOFF period to be performed without prematurely resuming a suspended operation, as a result the additional memory instructions may have a tLAT period that may be a relatively short tLAT period. The tHOLDOFF period may also be used to delay starting background operations within the memory, such as wear leveling, consolidating fragmented blocks of data in memory, performing device evaluation and adjustment, as well as other background operations. That is, background operations are not started until after the tHOLDOFF period ends in order to avoid a relatively long tLAT period for any additional memory instructions.

For example, as in the previous example, a write operation in progress was suspended to begin performing the operation for a read instruction. A tHOLDOFF period (i.e., first tHOLDOFF period) may begin following the completion of the read instruction, during which an additional read instruction is received. As a result, the suspended write operation remains suspended and the read operation for the additional read instruction begins. Due to the continued suspension of the write operation, the tLAT period for the additional read instruction may be a relatively short tLAT period. Upon completion of the additional read instruction, another tHOLDOFF period (i.e., second tHOLDOFF period) begins, during which receipt of other additional read instructions will cause the write operation to be further suspended. The further additional read instructions may also have a tLAT period that may be a relatively short tLAT period. However, in the event no other read instructions are received during the second tHOLDOFF period the suspended write operation may be resumed and completed.

In some embodiments, receipt of a specific type or types of memory instructions will result in a suspended memory operation to be resumed. For example, assuming again a write operation is suspended upon receipt of read instruction. The read operation for the instruction begins and is completed, at which time a tHOLDOFF period begins. As previously described, receipt of a read instruction during the tHOLDOFF period may cause the suspended write operation to remain suspended. However, if a write instruction is received during the tHOLDOFF period, this type of memory instruction may cause the suspended write operation to resume immediately to be completed. The write operation for the new write instruction may be performed following completion of the previously suspended write operation, or in some embodiments, queued to be later performed, for example, due to receipt of a read instruction after the new write instruction was received but before completion of the resumed write operation.

Although previously described in the context of a suspended memory operation, the tHOLDOFF period may be available even when there are not any memory operations suspended. That is, a tHOLDOFF period may follow the completion of a memory operation, for example, a memory operation for a read instruction, during which time no other memory operations are initiated. A memory operation for an instruction received during the tHOLDOFF period may consequently have a relatively short tLAT given that no other memory operations are in progress. In some embodiments, receipt of write instructions during the tHOLDOFF period may force the tHOLDOFF period to immediately expire and not be restarted. The tHOLDOFF period may be used with suspended operations or when no other memory operations are pending to allow a memory to remain ready to perform a memory operation for an instruction received during the tHOLDOFF period, resulting in relatively short tLAT periods.

A maximum time for tLAT and the time for a tHOLDOFF period may be programmable in some embodiments of the invention. For example, a register may be included in a memory (e.g., register 160 of FIG. 1) which is used to store values indicative of a maximum tLAT, and store values indicative of the time for the tHOLDOFF period. The maximum time for tLAT may set the maximum tLAT time for a memory operation, and may be used by a memory, for example, to determine whether to suspend a current memory operation in progress, or to allow a current memory operation to complete before turning to the memory operation. Separate maximum tLATs may be set for read and write operations in some embodiments. The maximum tLAT value and/or the tHOLDOFF period may in some embodiments be programmable by a host, and may be based on, for example, facilitating efficient execution of microcode. The value programmed for tLAT may identify one of several predefined maximum values in some embodiments. In some embodiments, a value may be stored in the register indicative of a maximum number of operations that may be performed during a tLAT period, thus establishing a maximum tLAT period.

Figure 6:
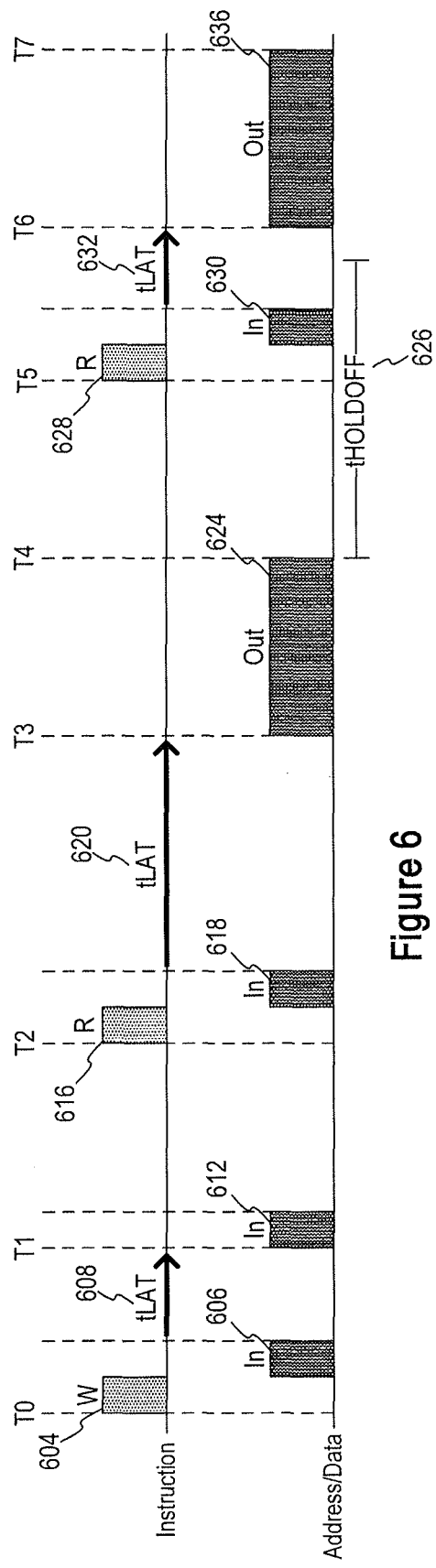
FIG. 6 is a sequence of read and write instructions according to an embodiment of the invention illustrating an example operation.

FIG. 6 illustrates a sequence of read and write instructions according to an embodiment to illustrate an example operation of a memory.

At time T0 a write instruction 604 and address 606 are received by the memory. Assuming that the memory was idle prior to time T0, the write operation for the write instruction 604 will have a relatively short tLAT 608. As previously described, a buffer may be used to store instructions, address and write data to provide a relatively short tLAT period, for example. As a result, write data 612 for the write instruction 604 can be received at time T1, which is relatively soon after the write instruction 604 was received at time T0. Following receipt of the write data 612 at time T1, internal memory operations are performed for the write operation. As illustrated in the example of FIG. 6, at time T2 a read instruction 616 and address 618 are received by the memory. The read operation for the read instruction 616 will have a relatively long tLAT 620 assuming that the write operation for the write instruction 604 of time T0 is to be completed or suspended before performing the read operation. Following the tLAT 620, at time T3 read data 624 for the read instruction 616 is made available by the memory. A tHOLDOFF period 626 begins at time T4 following provision of the read data 624. Time T4 may represent the completion of the read operation for the read instruction 616. At time T5 a read instruction 628 and address 630 are received by the memory. As illustrated in FIG. 6, the read instruction 628 is received within the tHOLDOFF period 626. Thus, the read operation for the read instruction 628 can begin immediately, and will have a relatively short tLAT 632. Read data 636 is provided by the memory at time T6 following the tLAT 632, and through to time T7, which represents the end of the read operation for the read instruction 628.

By comparison, the tLAT 632 is shorter than the tLAT 620. As previously described, the tLAT 620 may have resulted from waiting for the write operation for the write instruction 604 to complete or be suspended before performing the read operation for the read instruction 616. In contrast, the tLAT 632 of the read operation for the read instruction 628 is shorter because the memory was waiting the tHOLDOFF period 626 before turning to other memory operations. As such, the memory was able to begin performing the read operation for the read instruction 628 when it was received within the tHOLDOFF period 626 at time T5. Although not shown in FIG. 6, read operations for subsequently received read operations will also have relatively short tLATs if the read instruction is received within a tHOLDOFF period.

As illustrated by FIG. 6, the write operation for the write instruction initially received is completed or suspended before initiating the read operation for the read instruction 616 received at time T2. As a result, the tLAT for the read instruction 616 will be relatively long to allow the write operation to complete or be suspended. However, the read operation for the read instruction 628 received at time T5 has a tLAT that is relatively short due to receiving the read instruction within the tHOLDOFF period 626. As previously discussed, memory operations for instructions received during the tHOLDOFF period 626 may have relatively short tLAT because the memory remains idle for the tHOLDOFF period, after which it may resume a suspended memory operation. Thus, the operation for an instruction received during the tHOLDOFF period 626 can be performed without waiting for another memory operation to complete or be suspended and consequently have a relatively short tLAT.

Figure 7:
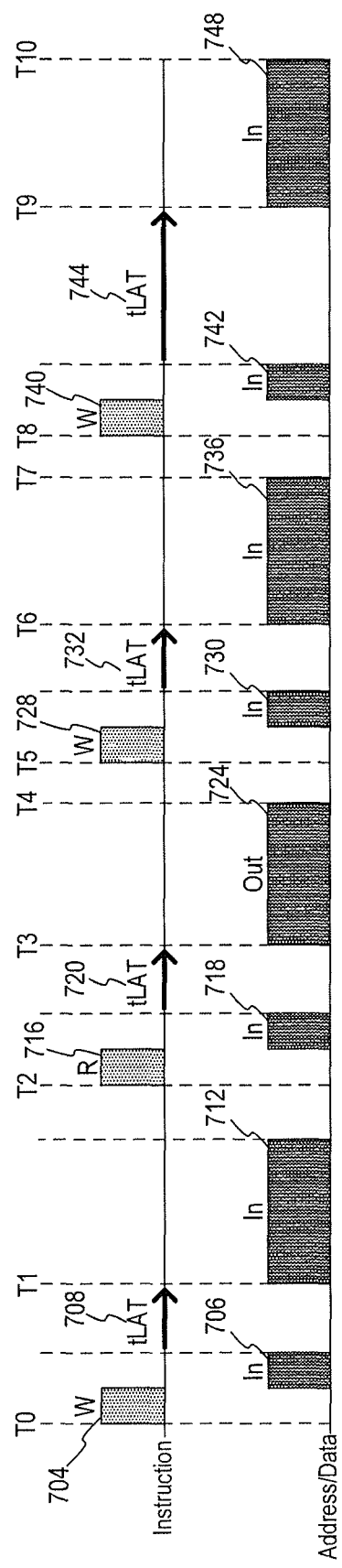
FIG. 7 is a sequence of read and write instructions according to an embodiment of the invention illustrating an example operation.

FIG. 7 illustrates a sequence of read and write instructions according to an embodiment to illustrate an example operation of a memory.

At time T0 a write instruction 704 and address 706 are received by the memory. Assuming that the memory was idle prior to time T0, the write operation for the write instruction 704 will have a relatively short tLAT 708. As a result, write data 712 for the write instruction 704 can be received at time T1, which is relatively soon after the write instruction 704 was received at time T0. Following receipt of the write data 712 at time T1, internal memory operations occur to perform the write operation. The internal memory operations may include writing the write data 712 to a write data buffer in which write data may be stored before being written to memory. As previously discussed, use of a write data buffer may allow for a write operation to be completed relatively quickly because writing write data to the write data buffer may take less time than writing write data to memory. At a later time, however, write data accumulated in the write data buffer will be written to memory, which may take a relatively long time, and may result in a memory operation for a subsequently received instruction having a relatively long tLAT. In the example of FIG. 7, however, the tLAT 708 is illustrated as relatively short.

As illustrated in the example of FIG. 7, at time T2 a read instruction 716 and address 718 are received by the memory. The read operation for the read instruction 716 is illustrated in FIG. 7 with a relatively short tLAT 720. The tLAT 720 may be relatively short given that the write operation for the write instruction 704 may be completed by time T2. Following the tLAT 720, from time T3 to T4 read data 724 for the read instruction 716 is made available by the memory. A tHOLDOFF period 726 begins at time T4 after the completion of the read operation. As previously discussed, during the tHOLDOFF period the memory does not initiate or resume any memory operations.

At time T5 a write instruction 728 and address 730 are received by the memory. With the read operation for the read instruction 716 completing by time T4 and the tHOLDOFF period 726 still elapsing, the write operation for the write instruction 728 may begin immediately by forcing the tHOLDOFF period to expire and in a relatively short tLAT 732. After which write data 736 may be received by the memory at time T6. At time T7, receipt of the write data 736 is completed. In the example of FIG. 7, although the tLAT 732 is relatively short, the write operation for the write instruction 728 may begin internal memory operations to write the write data accumulated in a write data buffer to a memory array. For example, in some embodiments, a write instruction received during a tHOLDOFF period may cause a write operation to begin, or in the event a previous memory operation has been suspended, cause the suspended operation to resume. As a result, a write operation for a subsequently received memory instruction may have a tLAT longer than the relatively short tLAT 732. For example, at time T8 a write instruction 740 and address 742 are received by the memory. Although receipt of the write data for the write instruction 728 is completed by receipt of the write instruction 740 at time T8, the write operation for the write instruction 740 is illustrated in FIG. 7 as having a tLAT 744 that is longer than the relatively short tLAT 732. The longer tLAT 744 may result from the internal memory operations being performed for previous write instructions (e.g., write instructions 704 and 728). That is, as previously discussed the write operations for the write instructions 704 and 728 may have relatively short tLATs 708 and 732, but the write operation for the write instruction 728 may include writing buffered write data to a memory array. The write operation for the write instruction 728 may not complete by time T8 when the write instruction 740 is received by the memory causing a longer tLAT 744. Following the longer tLAT 744, write data for the write instruction 740 is received by the memory between times T9 and T10.

As illustrated by FIG. 7, the write operation for the write instruction 704 initially received has a short tLAT 708. The write operation is also completed in a relatively short time, for example, through the use of a write data buffer, before receiving the read instruction 716 received at time T2. As a result, the tLAT 720 for the read instruction 716 will be relatively short. The write operation for the write instruction 728 received at time T5 also has a relatively short tLAT 732. A relatively short tLAT may be due to the fact that there is no suspended operations that need to be resumed and completed, for example, the relatively short tLAT 732 may be due to at least in part on the use of a write data buffer to store the write data rather than being stored to the memory array, which typically takes more time than writing to the write data buffer. For example, the short tLAT 732 may be due to the write instruction 728 being received within the tHOLDOFF period 726 following the completion of the read operation at time T4 for the read instruction 716. In contrast, the write operation for the write instruction 740 received at time T8 has a tLAT 744 that is longer than tLAT 732. As previously discussed, the longer tLAT 744 may be due to, for example, performing operations for writing write data stored in the write data buffer to the memory array before receiving the write data 748 between times T9 and T10.

Figure 8:
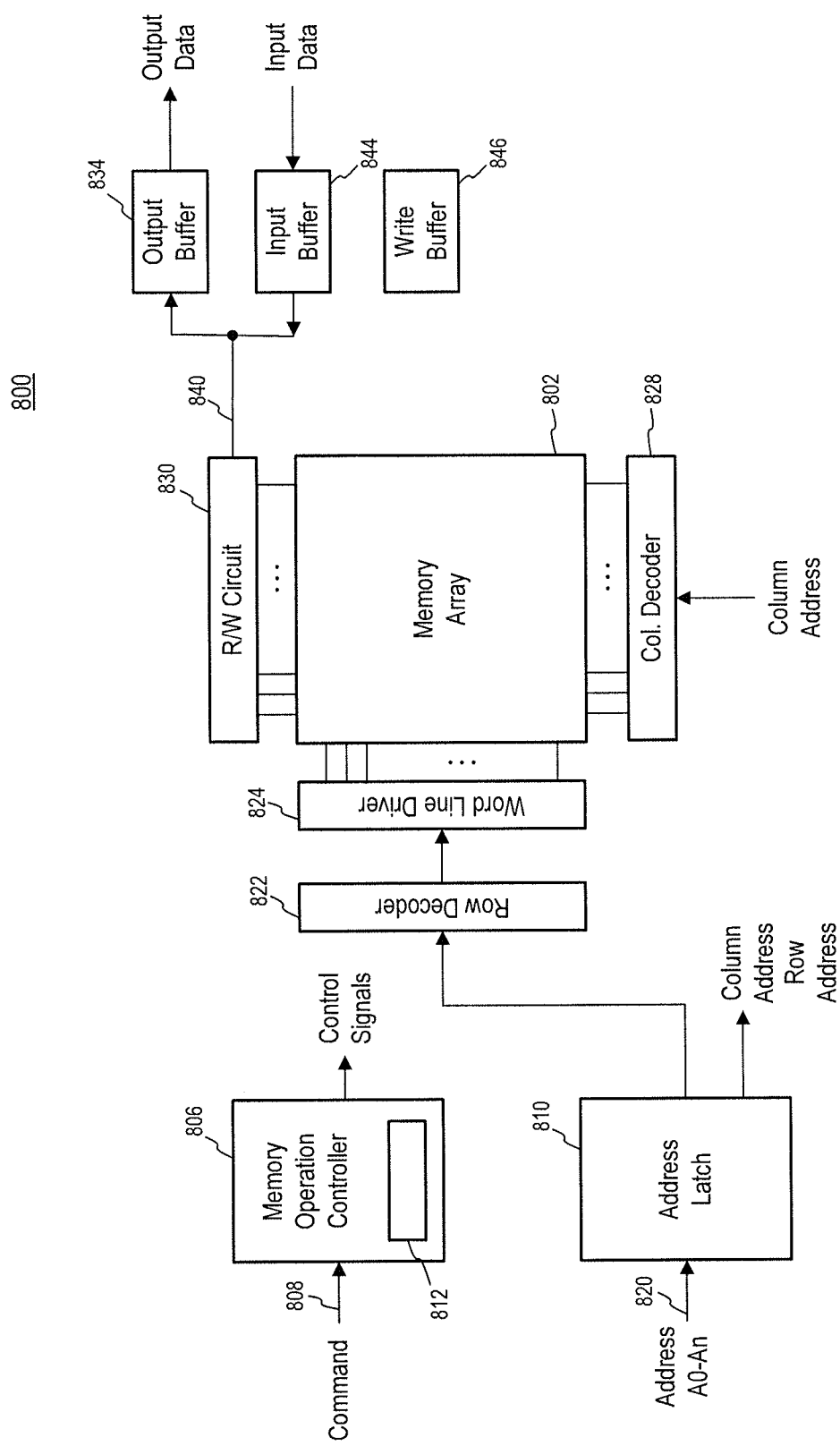
FIG. 8 is a block diagram of an apparatus according to an embodiment of the invention.

FIG. 8 is a schematic illustration of a portion of an apparatus (e.g. a memory device, such as a memory module, or a memory system, such as a solid-state drive) 800 according to an embodiment of the present invention. The apparatus 800 includes an array 802 of memory cells, which may be, for example, resistance variable memory cells, including phase change memory cells, resistance variable random access memory cells, or other types of memory cells. The apparatus 800 also includes a memory operation controller 806 according to an embodiment of the invention, that may receive memory instructions through an instruction bus 808 and generate corresponding control signals within the apparatus 800 to cause various memory operations to be carried out. For example, the memory operation controller 806 may generate control signals for performing read operations and write operations according to embodiments of the invention. The memory operation controller 806 includes a register 812 that may be used to store values related to the configuration and operation of the apparatus 800. In some embodiments, the register 812 may store values indicative of a maximum tLAT, and store values indicative of the time for the tHOLDOFF period, among other values. The register 812 is not limited to being included in the memory operation controller 806, and may be separate from the memory operation controller and/or included in another element of apparatus 800.

Row and column address signals may be provided through an address bus 820 to an address latch 810 of the apparatus 800. In some embodiments, the address bus 820 may be combined with the instruction bus 808, and in some embodiments the address bus 820 may be combined with a data bus. The address latch 810 may then output a separate column address and a separate row address. The row and column addresses may be provided by the address latch 810 to a row address decoder 822 and a column address decoder 828, respectively. The column address decoder 828 may select bit lines extending through the array 802 corresponding to respective column addresses. The row address decoder 822 may be connected to word line driver 824 that may activate respective rows of memory cells in the array 802 corresponding to received row addresses. The selected data line (e.g., a bit line or bit lines) corresponding to a received column address may be coupled to read/write circuitry 830 to provide read data to a data output buffer 834 via an input-output data bus 840. Write data may be provided to the memory array 802 through a data input buffer 844 and the memory array read/write circuitry 830. A buffer 846 of the apparatus 800 may be used to store write data and/or write instructions to be performed, a previously discussed.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a memory controller configured to provide memory instructions;
a memory coupled to the memory controller and configured to receive a memory instruction therefrom and perform a memory operation responsive thereto, the memory further configured to manage the memory operation during a variable latency period, the memory further configured to provide an acknowledgement indicative of an end of the variable latency period wherein the acknowledgement includes information related to an acceptance of the memory instruction, the memory further configured to exchange data associated with the memory instruction with the memory controller following the acknowledgement; and
a register configured to store a maximum variable latency period, wherein the register is configured to store a maximum variable latency period for write operations and store a maximum variable latency period for read operations.

2. The apparatus of claim 1 wherein the memory includes a write buffer configured to store write data.

3. The apparatus of claim 1 wherein the memory is further configured to suspend a write operation in progress responsive to receiving a read instruction.

4. The apparatus of claim 1 wherein the memory is configured to receive memory instructions, addresses, and data on shared input/outputs.

5. The apparatus of claim 1 wherein the memory is configured to receive memory instructions and addresses on a shared input, and data on input/outputs.

6. The apparatus of claim 1 wherein the memory is configured to prepare itself for a memory operation during the variable latency period.

7. The apparatus of claim 1 wherein the acknowledgement includes the information that the latency period has ended with further qualifications.

8. The apparatus of claim 1 wherein the acknowledgement includes information that the memory instruction is accepted but there is a warning due to the occurrence of an error during an operation of a previous memory instruction.

9. The apparatus of claim 1 wherein the acknowledgement includes information that the memory instruction is accepted but there is a warning due to the need of a house keeping operation.

10. The apparatus of claim 9 wherein the house keeping operation comprises at least one of wear leveling, refreshing, or combinations thereof.

11. The apparatus of claim 1 wherein the acknowledgement includes information that the memory instruction is rejected.

12. The apparatus of claim 1 wherein the memory is configured to wait a bus turnaround time following the acknowledgement before data is received by the memory.

13. An apparatus, comprising:
a memory array having memory cells;

a memory operation controller configured to receive memory instructions and decode the same to provide internal signals for performing memory operations for the memory instructions, the memory operation controller further configured to wait a predetermined hold-off period following performance of the memory operations, to await additional memory instructions, before resuming a suspended memory operation; and a register configured to store a maximum variable latency period, wherein the register is configured to store a maximum variable latency period for write operations and store a maximum variable latency period for read operations.

14. The apparatus of claim 13 wherein the memory operation controller is configured to suspend a write operation in response to receipt of a read instruction and perform a read operation.

15. The apparatus of claim 14, further comprising a register configured to store a maximum hold-off period and the memory operation controller is configured to wait the maximum hold-off period and then resume the suspended write operation.

16. The apparatus of claim 14 wherein the memory operation controller is configured to continue to suspend the write operation responsive to receipt of the read instruction during the hold-off period and to perform the read operation and to restart the hold-off period at the end of the read operation.

17. The apparatus of claim 14 wherein the memory operation controller is configured to resume the suspended write operation in response to receipt of a write instruction.

18. The apparatus of claim 13 wherein the memory cells comprise phase change memory cells.

19. The apparatus of claim 13 wherein the memory operation controller is configured to provide an acknowledgement indicative of an end of a variable latency period for a memory instruction.

20. The apparatus of claim 19 wherein the memory operation controller is configured to manage memory operations during the variable latency period.

21. The apparatus of claim 19 wherein the memory operation controller is configured to prepare memory circuits for performing memory operations during the variable latency period.

22. An apparatus, comprising:
a memory array having memory cells;
a write buffer configured to store write data to be written to the memory array;
a memory operation controller configured to receive memory instructions and decode the same to provide internal signals for performing memory operations for the memory instructions, the memory operation controller further configured to provide an acknowledgement indicative of an end of the variable latency period;
a register coupled to the memory operation controller and configured to store information related to a hold-off period following completion of a read operation to await additional memory instructions before resuming a suspended write operation and further configured to store a maximum variable latency period, wherein the register is configured to store a maximum variable latency period for write operations and store a maximum variable latency period for read operations.

23. The apparatus of claim 22 wherein the register is configured to store information related to a maximum latency period for read and write operations.

24. The apparatus of claim 23 wherein the memory operation controller is configured to determine whether to suspend a current memory operation in progress or to allow a current memory operation to complete based at least in part on the maximum latency period.

25. The apparatus of claim 22 wherein the register is included in the memory operation controller.

26. The apparatus of claim 22 wherein the memory operation controller is configured to suspend a memory operation in progress to begin performing a new memory operation during the variable latency period based at least in part on stored information related to a maximum latency period.

27. The apparatus of claim 22 wherein the memory operation controller is configured to complete a memory operation during the variable latency period based at least in part on stored information related to a maximum latency period.

28. A method, comprising:
receiving at a memory a read instruction and an address from which read data is to be read;
during a variable latency period for the read instruction, suspending a write operation responsive to the read instruction;
providing an acknowledgement indicative of an end of the variable latency period;
providing the read data for the read instruction;
continuing to suspend the write operation for a hold-off period following completion of the read operation, wherein the memory waits for additional memory instructions during the hold-off period;
receiving another read instruction during the hold-off period;
further suspending the write operation responsive to receiving the another read instruction; and
performing a read operation for the another read instruction and restarting the hold-off period at the end of the read operation.

29. The method of claim 28 wherein the read data for the read instruction is provided following providing the acknowledgement.

30. The method of claim 28, further comprising:
receiving a write instruction during the restarted hold-off period;
resuming the suspended write operation responsive to receiving the write instruction.

31. The method of claim 28, further comprising:
resuming the suspended write operation responsive to the restarted hold-off period expiring.

* * * * *